US006891420B2

(12) United States Patent
Martin et al.

(10) Patent No.: US 6,891,420 B2
(45) Date of Patent: *May 10, 2005

(54) METHOD AND APPARATUS FOR DIGITAL FREQUENCY SYNTHESIS

(75) Inventors: Frederick L. Martin, Plantation, FL (US); Robert E. Stengel, Pompano Beach, FL (US); Jui-Kuo Juan, Coral Springs, FL (US)

(73) Assignee: Motorola, Inc., Schaumburg, IL (US)

( * ) Notice: Subject to any disclaimer, the term of this patent is extended or adjusted under 35 U.S.C. 154(b) by 435 days.

This patent is subject to a terminal disclaimer.

(21) Appl. No.: 10/036,558

(22) Filed: Dec. 21, 2001

(65) Prior Publication Data

US 2003/0119465 A1 Jun. 26, 2003

(51) Int. Cl.⁷ .............................. H04B 1/40; H04B 7/00
(52) U.S. Cl. ...................... 327/260; 455/76; 455/165.1; 455/183.1; 455/209; 455/550.1; 375/327; 375/373; 375/376
(58) Field of Search .................. 455/76, 183.1, 455/165.1, 209, 242.1, 242.2, 243.1, 260, 550.1; 375/327, 354, 373, 375, 376; 327/269, 271, 272, 276–277, 284, 294

(56) References Cited

U.S. PATENT DOCUMENTS

| 4,346,477 | A | * | 8/1982 | Gordy ......................... 455/257 |
| 4,742,563 | A | | 5/1988 | Fukumura ................... 455/132 |
| 4,980,585 | A | * | 12/1990 | Bazes ......................... 327/106 |
| 5,303,400 | A | | 4/1994 | Mogi ....................... 455/186.1 |
| 5,471,659 | A | | 11/1995 | Wong ........................ 455/132 |
| 5,535,247 | A | | 7/1996 | Gailus et al. ................ 375/297 |
| 5,748,683 | A | | 5/1998 | Smith et al. ................ 375/347 |
| 5,889,436 | A | * | 3/1999 | Yeung et al. .................. 331/2 |
| 5,913,155 | A | | 6/1999 | Tomiyama ................... 455/142 |
| 5,977,805 | A | * | 11/1999 | Vergnes et al. ............. 327/107 |
| 6,037,812 | A | * | 3/2000 | Gaudet ........................ 327/116 |
| 6,044,120 | A | | 3/2000 | Bar-David et al. .......... 375/347 |
| 6,100,735 | A | | 8/2000 | Lu ............................... 327/158 |
| 6,104,223 | A | * | 8/2000 | Chapman et al. ........... 327/276 |
| 6,148,186 | A | | 11/2000 | Fujita ......................... 455/137 |
| 6,205,193 | B1 | | 3/2001 | Solve et al. ................. 375/354 |
| 6,226,505 | B1 | | 5/2001 | Uda ............................ 455/255 |
| 6,236,690 | B1 | | 5/2001 | Mimura et al. ............. 375/334 |
| 6,353,649 | B1 | * | 3/2002 | Bockleman et al. ........ 375/376 |
| 6,480,047 | B2 | * | 11/2002 | Abdel-Maguid et al. .... 327/161 |
| 6,484,038 | B1 | * | 11/2002 | Gore et al. .............. 455/552.1 |
| 6,510,191 | B2 | * | 1/2003 | Bockelman ................. 375/371 |
| 6,515,633 | B2 | | 2/2003 | Ippolito ...................... 343/797 |
| 6,556,630 | B1 | | 4/2003 | Brinsfield et al. .......... 375/335 |
| 2002/0032042 | A1 | | 3/2002 | Poplawsky et al. | |
| 2003/0099321 | A1 | | 5/2003 | Juan | |
| 2003/0152181 | A1 | | 8/2003 | Stengel et al. | |

OTHER PUBLICATIONS

Jerry D. Gibson, "The Communications Handbook", 1997, CRC Press, p. 11.

* cited by examiner

*Primary Examiner*—Simon Nguyen

(57) ABSTRACT

A digital frequency synthesizer includes one or more reference clocks (104, 1316, 1502A, 1504A, 1506A) optionally coupled through one or more pulse width reducers (106) to one or more main delay lines (108, 702, 1502B, 1504B, 1506B) that include a plurality of output taps (108B–108I, 702B–702E). During at least certain periods of the reference clock (104) a plurality of the output taps are coupled to a common output (130, 1312, 1508), thereby producing an output signal that has a frequency that exceeds a frequency of the one or more reference clocks. The coupling is preferably accomplished by transmission gates (114, 128, 720–724, 1420–1434) that are switched by gating pulses that are received from decoders (148, 150, 1418) via gating signal delay lines (134–146, 704–718, 1404–1416).

16 Claims, 9 Drawing Sheets

REDUCED WIDTH CLOCK PULSES

TRIGGER PULSES

PULSES SELECTED BY FIRST DECODER

PULSES SELECTED BY SECOND DECODER

PULSES SELECTED BY BOTH DECODERS

METHOD AND APPARATUS FOR DIGITAL FREQUENCY SYNTHESIS

FIELD OF THE INVENTION

This invention pertains to frequency agile signal sources. More particularly this invention pertains to digital frequency synthesizers.

BACKGROUND OF THE INVENTION

Presently wireless communication devices of a given type (e.g., wireless telephones, or pagers) may be designed to operate in a variety of frequency bands depending on the jurisdiction in which the device is to be operated, and the communication protocol that is to be supported by the device. The latter necessitates the design, manufacture and maintenance of inventories of devices for each frequency band. Moreover a device that is designed to support a given frequency band and a given protocol may not be easily modified for use in a different frequency band.

Within wireless devices quartz resonators are commonly used in a system reference clock to establish the frequency of operation. Unfortunately, due to the high cost of high frequency quartz resonators it is undesirable to include multiple quartz resonators in order to support multiple bands of operation in each wireless communication device.

Recently MEMS resonators have been proposed as a low cost substitute for quartz oscillators. Unfortunately the frequencies of operation of MEMS resonators are low relative to carrier frequencies used in digital communication.

What is needed is a signal source that can generate signals at multiple frequencies.

Furthermore what is needed is multiple frequency signal source that can produce relatively high frequencies based on a low frequency reference clock

BRIEF DESCRIPTION OF THE FIGURES

The features of the invention believed to be novel are set forth in the claims. The invention itself, however, may be best understood by reference to the following detailed description of certain exemplary embodiments of the invention, taken in conjunction with the accompanying drawings in which:

DETAILED DESCRIPTION OF THE PREFERRED EMBODIMENT

Figure 1:
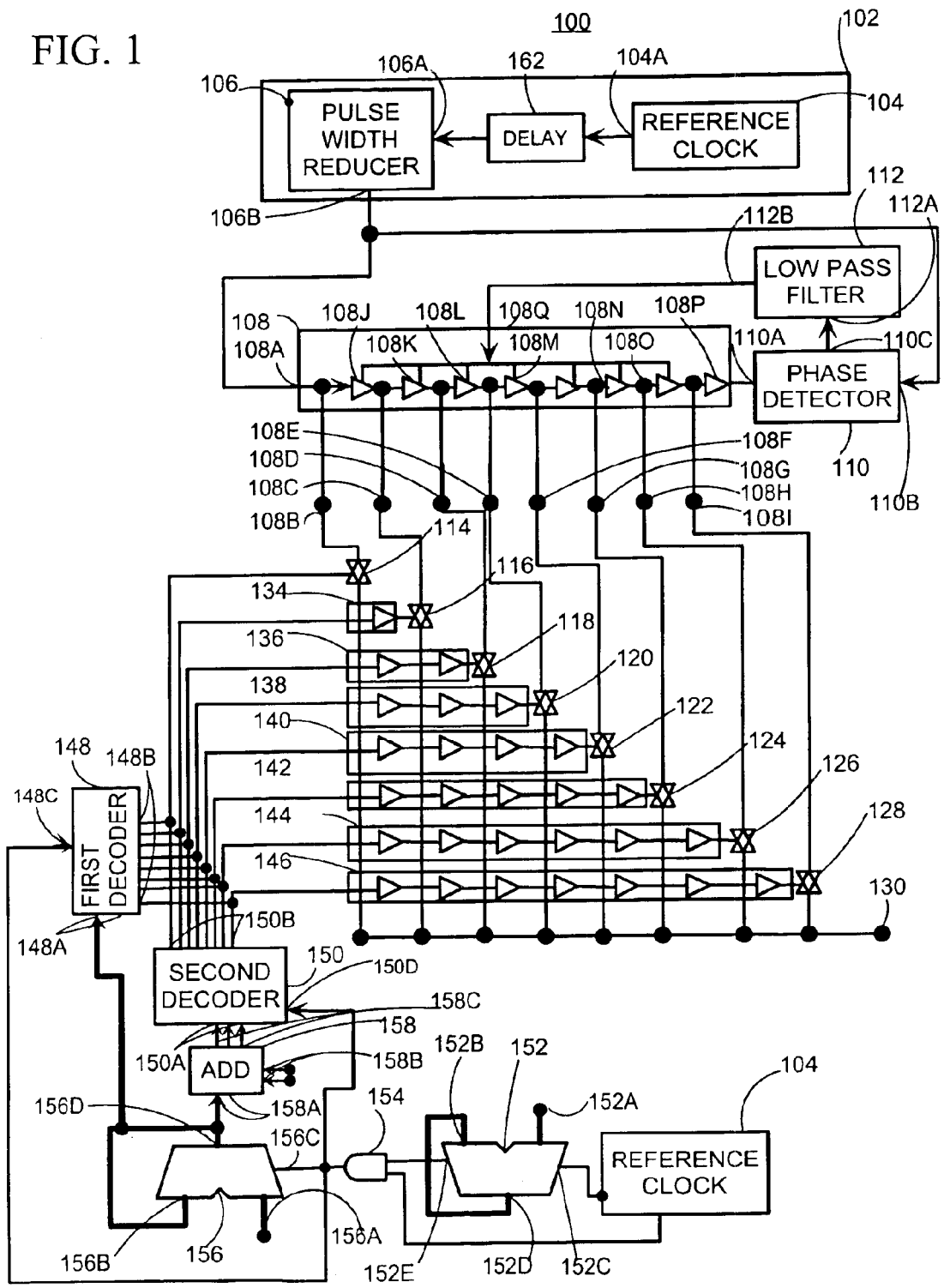
FIG. 1 is a block diagram of a digital frequency synthesizer according to a first embodiment of the invention.
Figure 2:
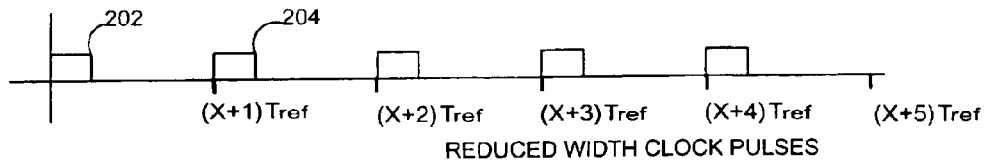
FIG. 2 is a graph showing a sequence of reduced width pulses output by a pulse width reducer of the digital frequency synthesizer shown in FIG. 1.

While this invention is susceptible of embodiment in many different forms, there are shown in the drawings and will herein be described in detail specific embodiments, with the understanding that the present disclosure is to be considered as an example of the principles of the invention and not intended to limit the invention to the specific embodiments shown and described. Further, the terms and words used herein are not to be considered limiting, but rather merely descriptive. In the description below, like reference numbers are used to describe the same, similar, or corresponding parts in the several views of the drawings.

The present invention provides a method an apparatus for generating high frequency signals using a relatively low frequency clock signal. Such high frequency signals are useful as, among other things, carrier wave or local oscillator signals in communication devices. The present invention provides a relatively low cost, low power consumption circuit that may be used in conjunction with a low cost low frequency reference clock.

FIG. 1 is a block diagram of a digital frequency synthesizer 100 according to a first embodiment of the invention. A reduced width signal source 102 outputs a relatively low frequency signal that has a reduced (i.e., less than 50%) duty cycle, and is characterized by clock signal period (inverse frequency). The reduced width signal source 102 includes a reference clock 104, and pulse width reducer 106. The reference clock is preferably based on a lower cost lower frequency resonator. An embodiment of the pulse width reducer is described below in more detail with reference to FIG. 10. An output 104A of the reference clock 104 is coupled through delay 162 to an input 106A of the pulse width reducer 106.

An output 106B of the pulse width reducer 106 is coupled to an input 108A of a main delay line 108. The main delay line 108 preferably includes a series of active elements 108J–108P. More preferably the active elements 108J–108P include CMOS inverters. The main delay line 108 includes a plurality of output taps 108B–108I. The output taps 108B–108I are preferably taken off outputs of the active elements 108J–108P. (In the case that the active elements are CMOS inverters, the taps are preferably taken off an output of every other CMOS inverter.) Each of the output taps 108B–108I is separated from the input 108A by a certain propagation delay time. Preferably, the output taps 108B–108I are preferably spaced by equal propagation delay time increments. A zeroth output tap 108B is located closest among the plurality of taps 108B–108I to the main delay line input 108A. A last tap 108I is located furthers among the plurality of taps 108B–108I from the main delay line input 108A. According to the first embodiment of the invention a total propagation delay time separating the zeroth output tap 108B from the last output tap 108I is preferably about equal to the 2*(n−1)/n times clock signal period, where n is the number of taps 108B–108I. More generally, according to the teachings of the present invention, the total propagation delay line separating the zeroth and last output taps 108B, 108I is preferably about p*(n−1)/n where p is an integer number of periods of the reference clock 104. The total propagation delay length of the main delay line 108 is preferably about equal to twice the period of the reference clock 104. Although eight taps 108B–108I are shown in FIG. 1, for the purpose of illustration, the main delay line 108 preferably comprises at least about 512 taps, and more preferably at least about 1024 taps. The number of taps is preferably a power of two. By selecting a large number of taps the resolution with which an output signal phase may be selected is increased.

The total propagation delay time between the main delay line input 108A and the output of the last buffer 108P is preferably maintained by feedback with the use of a phase detector 110, and low pass filter 112 at the reference clock period. The phase detector 110 comprises a first input 110A that is connected to an output of the last active element 108P and a second input 110B that is connected to the output 106B of the pulse width reducer 106. The phase detector 110 compares a difference between the phases of signals received at the two phase detector inputs 110A, 110B to a predetermined value, and outputs a signal that varies in relation to that difference at a phase detector output 110C. The phase detector output 110C is coupled to an input 112A of a low pass filter 112. An output 112B of the low pass filter 112 is coupled to a propagation delay control input 108Q of the main delay line 108. In the case that the active elements 108J–108P of the main delay line 108 comprise CMOS inverters, the propagation delay control input may be used to control a supply voltage for the CMOS inverters, thereby controlling the propagation delay characteristics of the CMOS inverters, and in turn the total delay time from zeroth 108B to last 108I output tap.

Each of the taps 108B–108I are coupled to a first signal terminal of one of a plurality of transmission gates 114–128. Alternatively other types of switches may be used in lieu of transmission gates 114–128. Each of the transmission gates 114–128 in addition to having a first signal terminal includes a second signal terminal and a gate control terminal. Within each transmission gate 114–128 coupling between the first signal terminal and the second signal terminal is controlled by signals applied to the gate control terminal. The second signal terminals of the transmission gates 114–128 are coupled to a common output 130.

The gate control terminals of all but the first 114 of the transmission gates 114–128 are coupled to an output end of one of a plurality of gate signal delay lines 134–146. A propagation delay length that characterizes each particular gate signal delay line is commensurate with a delay associated with a tap among the plurality of taps 108B–108I that is coupled to a transmission gate among the plurality of transmission gates 114–128 to which the particular gate signal delay line is coupled. The effect of the latter design is as follows. If a reduced pulse width clock signal is input into main delay line 108 at the same instant that a gate control signal pulse is input into a particular gate signal delay line say, 136, then the gate control signal pulse will reach the transmission gate 118 at the output of the gate signal delay line 136 at approximately the same time that the reduced duration clock signal reaches the tap 108D that is coupled to the transmission gate 118 at the output of the gate signal delay line 136. Thus, the reduced pulse width clock signal will be gated through the transmission gate 118 to the common output 130.

Each of the gate signal delay lines 134–146 includes an input that is coupled one of a plurality of outputs 148B of a first decoder 148 and to one of a plurality of outputs 150B of a second decoder 150. The gate control terminal of first transmission gate 114 is coupled to an output among the plurality of outputs 148B of the first decoder 148, and to an output among the plurality of outputs 150B of the second decoder 150. Thus either the first or second decoder 148, 150 may be used to gate signals through the transmission gates 114–128.

The first decoder 148 in combination with the gate signal delay lines 134–146, and transmission gates 114–128 serve as a first multiplexer, whereas the second decoder 150 in combination with the gate signal delay lines 134–146, and transmission gates 114–128 serve as a second multiplexer. Although less efficient in terms of the amount of circuitry, two completely separate multiplexers may be provided in lieu of the first and second decoders 148, 150, gate signal delay lines 134–146 and transmission gates 114–128.

Attention will now be turned to describing those parts of the digital frequency synthesizer 100 that control the first and second decoders 148, 150. The reference clock 104 is also coupled to a clock input 152C of a first adder 152. The first adder 152 includes a first input 152A for receiving a first control number k which is defined by the following equation:

$$k = \frac{f_{out}}{M \cdot f_{ref}} \qquad \text{Equ. 1}$$

where $f_{out}$ is the frequency of signal that the digital frequency synthesizer 100 is set to produce;

$f_{ref}$ is the frequency of the reference clock 104; and

M is equal to a maximum number of taps that may need to be selected during each period of the reference clock signal.

In the frequency synthesizer 100 depicted in FIG. 1, by providing two decoders 148, 150, two of the output taps 108B–108I may be selected during each period of the reference clock. Thus in connection with the frequency synthesizer shown in FIG. 1, M in equation 1 is set to two.

Alternatively k may be written in terms of periods as follows:

$$k = \frac{T_{ref}}{M \cdot T_{out}} \qquad \text{Equ. 2}$$

where

Tref is the period of the reference clock 104; and

Tout is the period of the signal that the digital frequency synthesizer is set to produce.

The first adder 152 further comprises a second input 152B, and a sum output 152D that is coupled to the second input 152B. By the former arrangement, with each period of the reference clock 104, the first adder 152 increments an output sum by first control number k. The two inputs 152A, 152B and the output 152D of the first adder 152 are preferably plural bits wide. For purposes of discussion, consistent with equations 1 and 2 above, the maximum output of the first adder 152 is considered to be normalized to unity. Each time the output of the first adder 152 overflows the maximum output of unity, an overflow signal is output from an overflow output 152E of the first adder 152. The overflow output 152E is coupled to a first input of an AND gate 154. The reference clock 104 is coupled to a second input of the AND gate 154. Thus when the first adder 152 overflows, and a HIGH signal state portion of the reference clock signal occurs, the AND gate 154 outputs a trigger pulse. The trigger pulse output by the AND gate 154 is coupled to three points in the synthesizer 100, namely a trigger input 148C of the first decoder 148, a trigger input 150C of the second decoder 150, and a clock signal input 156C of a second adder 156. The second adder 156 further comprises a first input 156A, a second input 156B and a sum output 156D. The first input 156A is used to input the a second control number C that is defined by the following expression:

$$C_{frac} = frac\left(\frac{M \cdot f_{ref}}{f_{out}}\right) \quad \text{Equ. 3}$$

$C_{frac}$ may also be expressed as:

$$C_{frac} = frac\left(\frac{M \cdot T_{out}}{T_{ref}}\right) \quad \text{Equ. 4}$$

where frac indicates that a fractional part of the expression in parenthesis is taken.

Equation 4 (or its equivalent equation 3) is preferably normalized by multiplying by a constant that is equal to one less than the number of taps of the main delay line 108 that are separated by a propagation delay time equal to the period of the reference clock 104. The normalized form of equation 4 is:

$$\text{Normalized\_}C_{frac} = (N-1) \cdot frac\left(\frac{M \cdot T_{out}}{T_{ref}}\right) \quad \text{Equ. 5}$$

where N is the number of taps of the delay line 108 that are separated by a delay of one period of the reference clock 104. N is 5 in the illustrative embodiment shown in FIG. 1, although it is preferably at least about 512.

The output 156D of the second adder 156 is coupled to the second input 156B of the second adder 156. Thus each time a trigger pulse is input at the clock signal input 156C of the second adder 156, a sum output at the output 156D of the second adder 156 is increased by the second control number C. The inputs 156A, 156B and the output 156D of the second adder 156 are preferably plural bits wide. The output 156D of the second adder 156 is used to control the selection of taps of the main delay line 108 so as to obtain a signal characterized by the desired frequency Fout, at the common output 130 as explained more fully below.

The output 156D of the second adder 156 is also coupled to a plurality of address select inputs 148A of the first decoder. Successive sums output by the second adder 156 when applied to the address inputs 148A of the first decoder 148, are used during periods (though not necessarily each successive) of the reference clock 104 to select one of the plurality of outputs 148B of the first decoder 148, and thereby to select one of the taps 108B–108I of the main delay line 108 for coupling to the common output 130.

The output 156D of the second adder 156 is also coupled to a first input 158A of a third adder 158. The third adder 158 serves as an address modifier for modifying addresses output by the second adder 156. A third control number is input at a second input 158B of the third adder 158. The third adder 158 adds successive sums output by the second adder 156 to the third control number and outputs a second series of sums. The second series of sums are applied as addresses during successive (though not necessarily each successive) periods of the reference clock 104, to a plurality of address inputs 150A of the second decoder 150, causing the second decoder 150 to select one of the plurality of outputs 150B of the second decoder 150. The third control number is given by the following equation:

$$\text{Normalized\_}C = \frac{(N-1) \cdot (m-1) \cdot T_{out}}{T_{ref}} \quad \text{Equ. 6}$$

where m is the number of the decoder (in the case of the first embodiment m is two) to which the sum including the third control number is applied. Note that the third control number also includes the leading factor (N−1) for the purpose of normalizing the third control number to the number of taps as discussed above. Although for the purpose of illustration the digital frequency synthesizer 100 only includes two decoders 148, 150, for the purpose of generating output frequencies of up to M times the reference clock frequency it is desirable to provide M means (e.g., decoders) for coupling taps of the main delay line 108 to the common output 130 so that M taps may be readily coupled to the common output 130 during each period of the reference clock 104. As stated above the main delay line preferably comprises a large number of output taps. M means for coupling taps of the main delay line 108 to the common output 108 are preferably provided by duplicating the arrangement of the third adder 158 and the second decoder 150 (M−1) number of times. These additional sets of adders and decoders would also be coupled between the output of the second adder 156 and the inputs of the gate signal delay lines 114–128. Rather than providing a single third control number of the form shown in equation six a set of control numbers that are obtained from equation six by allowing m to take on integer values from two (for the second decoder) up to one less than the number M of decoders. The additional control numbers would be input to the additional adders in a manner analogous to how the third control number is input to the third adder 158. Thus although the frequency synthesizer 100 is shown with two decoders 148, 150, in order to obtain higher output frequencies relative to the reference clock frequency a greater number of decoders and adders are provided. Frequency synthesizers where the number of decoders and adders is high offer the advantage that a high frequency signal for use in communication circuits may be provided using a relatively low frequency reference clock.

The three adders 152, 156, 158, the AND gate 154, and the reference clock 104 form a controller that controls the operation of the two decoders 148, 150.

A frequency synthesizer in which (N−1) tap position increments is equivalent to a propagation delay length of one period of the reference clock is suitable for generating output frequencies of up to (N−1) times the frequency of the reference clock. To do so, up to (N−1) taps may be selected and coupled to the common output 130 during each reference clock period.

In order to operate the frequency synthesizer 100, the values of the three control numbers will be set in accordance with the equations and relations discussed above to obtain a desired output frequency. The role of the first adder 152 is to determine if the selection of tap is to be initiated in each period of the reference clock. Note that the first adder 152 is driven by the reference clock 104. The selection of taps is initiated by the overflow of the first adder 152. If during a particular reference clock period no overflow occurs, the first input of the AND gate 154 is not set high and no trigger pulse is produced.

If an output frequency that exceeds the reference clock frequency is to be generated, then at least one tap must be coupled to the common output 130 during each period of the reference clock 104. However the latter does not imply that the selection of a tap must be initiated during each period of the reference clock 104. The coupling of taps to the common output 130 that occurs during certain periods of the reference clock 104, is initiated during preceding periods. The temporal separation between a clock period in which selection of tap is initiated, and a clock period in which coupling to the common output 130 occurs, is enabled, in the case of the first embodiment shown in FIG. 1, by the provision of a main delay line 108 that has propagation delay length of more than one reference clock period, and the provision of gate signal delay lines 114–128 some of which have propagation delay lengths in excess of one reference clock period. The last four taps 108F–108I of the main delay line are preferably separated from the zeroth tap 108B by propagation delay lengths at or greater than one reference clock period. Likewise, the gate signal delay lines 122–128 used to access those taps 108F108I have propagation delay lengths greater than one period of the reference clock.

The operation of the second adder 156 is driven by the first adder 152. Specifically, the second adder 156 is clocked by trigger pulses output by the AND gate 154, which only occur when the first adder 152 overflows. The second adder 156 is used to control which taps among the plurality of taps 108B–108I are selected when selection of taps is initiated by the first adder 152. As discussed above the output of the second adder 156 is used directly to control selection by the first decoder 148. The second decoder 150 is controlled by the output of the third adder 158 which increases the output of the second adder 156 before applying resulting sums to the address inputs 150A of the second decoder 150. The effect of the operation of the third adder 158 is to offset the selection of the second decoder 150 from the selection of the first decoder by a number of taps that is approximately equivalent to the period of the frequency generated by the frequency synthesizer 100.

The fixed delay 162 serves to ensure that gating pulses reaching the transmission gates 114–128 are synchronized with the reference clock signal propagating through the main delay line 108.

An illustrative example of the operation of the digital frequency synthesizer 100 will be discussed with reference to table 1.

Each row of Table 1 gives information for one of a sequence of consecutive reference clock periods. An index identifying each reference clock period is given in column 1. Column two indicates whether the first adder 152 overflowed during each cock cycle. The third column indicates the output of the first adder 152 after performing an add in each reference clock period. The number in parenthesis in the third column indicates what the output of the first adder 152 would be if the output of the first adder 152 were not limited to a maximum value (e.g., to unity). The fourth column indicates what the output of the second adder 156 is updated to during each reference clock period. The fifth indicates a number of a first tap that is selected during each reference clock period. In the fifth and seventh columns the alphanumeric in parentheses below the tap number is the reference numeral of the indicated tap as it appears in FIG. 1. The sixth column indicates a propagation delay from the zeroth tap 108B to the first selected tap, which is indicated in the fifth column, in terms of the reference clock period. The seventh column indicates a number of a second tap the selection of which is initiated during the reference clock period of the row in question. The last row indicates a propagation delay from the zeroth tap 108B to the second selected tap that is indicated in column seven in terms of the period of the reference clock.

The information presented in table 1 is for the case that the period of a signal that is generated by the digital frequency synthesizer 100 is three-quarters of the period of the reference clock 104. For such a case, applying equation two one obtains a value for the first control number of 4/6. Applying equation five one obtains a normalized value of the second control number (i.e. the number applied to the first input 156A of the second adder) of two tap positions. Similarly applying equation six yields a third control number (i.e. the number input at the second input 158B of the third adder 158) of 3 (tap positions).

Figure 3:
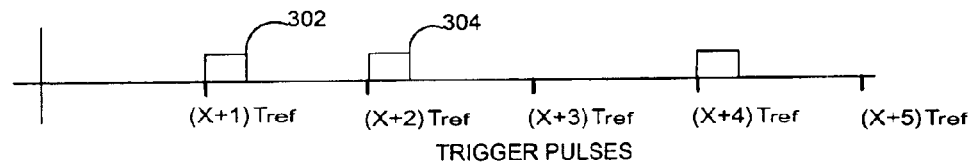
FIG. 3 is a graph showing a sequence of trigger signals output by an AND gate in the digital frequency synthesizer shown in FIG. 1
Figure 4:
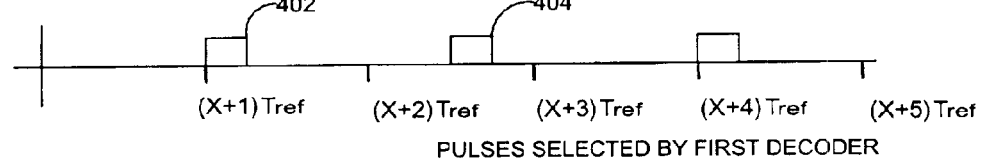
FIG. 4 is a graph showing pulses selected by a first decoder of the digital frequency synthesizer shown in FIG. 1.
Figure 5:
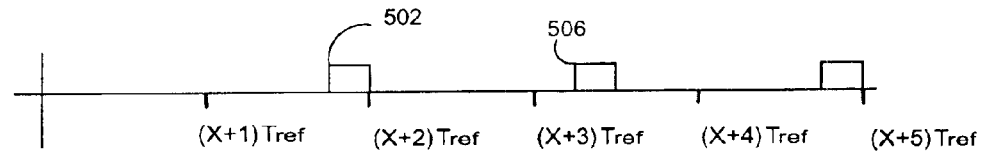
FIG. 5 is a graph showing pulses selected by a second decoder of the digital frequency synthesizer shown in FIG. 1.
Figure 6:
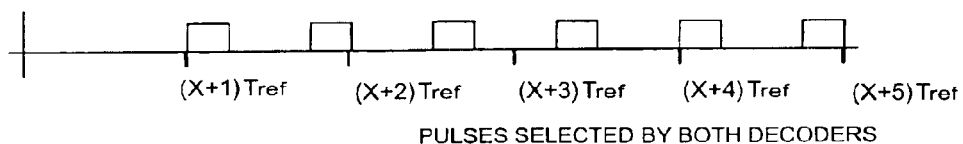
FIG. 6 is a graph showing pulses selected by both decoders of the digital frequency synthesizer shown in FIG. 1.

In further discussion of table 1 below reference is also made to FIGS. 2–6 which illustrate various signals produced by the digital frequency synthesizer 100 in accordance with the example. In FIGS. 2–6, FIG. 2 is a graph showing a sequence of reduced width pulses output by the pulse width reducer 106 of the digital frequency synthesizer 100, FIG. 3 is a graph showing a sequence of trigger signals output by an AND gate 154 in the digital frequency synthesizer 100, FIG. 4 is a graph showing pulses selected by a first decoder 148 of the digital frequency synthesizer 100, FIG. 5 is a graph showing pulses selected by a second decoder 150 of the digital frequency synthesizer 100, and FIG. 6 is a graph showing pulses selected by both decoders of the digital frequency synthesizer 100.

TABLE I

| Ref. Clock period | $1^{st}$ adder over-flow | $1^{st}$ adder output | $2^{nd}$ adder updated to: | $1^{st}$ Tap Selected | $1^{st}$ Selected Tap Delay | $2^{nd}$ Tap Selected | $2^{nd}$ Selected Tap Delay |
|---|---|---|---|---|---|---|---|
| X | No | 4/6 (4/6) | — | — | — | — | — |
| X + 1 | Yes | 2/6 (8/6) | 2 | $0^{th}$ (108B) | 0 | $3^{rd}$ (108E) | 3/4 |
| X + 2 | Yes | 0 (12/6) | 0 | $2^{nd}$ (108D) | 2/4 | $5^{th}$ (108G) | 5/4 |
| X + 3 | No | 4/6 (16/6) | — | — | — | — | — |
| X + 4 | Yes | 2/6 (20/6) | 2 | $0^{th}$ (108B) | 0 | $3^{rd}$ (108E) | 3/4 |

Referring to table 1, in the Xth reference clock period, in response to an Xth reference clock pulse 202, the output of the first adder 152 is increased by the first control number to 4/6. (The output of the first adder 152 is assumed to have been zero). Because the output had been zero and is increased to 4/6 the first adder 152 does not overflow. (The upper bound of the first adder 152 output of unity is not exceeded.) Therefore no trigger signal is output by the AND gate 154, and the selection of taps is not initiated. As will be apparent from the discussion of subsequent clock periods below, if the Xth clock cycle was not the first cycle of operation of the synthesizer 100, the coupling of a tap of the main delay line 108 to the common output 130 may occur during the Nth clock cycle, but it will have been initiated during the preceding clock cycle. As shown in FIGS. 2–6 the Xth reference clock period extends from time X*Tref to (X+1)*Tref.

In the X+1 reference clock period in response to a X+1th reference clock pulse 204, the first adder 152, adds the first control number to its output which causes the first adder 152 to overflow and its output to becomes 2/6. (Note that the output would have been 8/6 if the output of the first adder 152 were not limited to being less than unity). As a consequence of the overflow of the first adder 152, a trigger pulse 302 is output by the AND gate 154, and reaches the first and second decoders 148, 150. The trigger pulse causes each of the decoders 148, 150 to output a gating pulse at an output among the pluralities of outputs 148B, 150B that is designated by an address applied to the address select inputs 148A, 150A when the trigger pulse 302 is received. Each gating pulse propagates down a gate signal delay line that is coupled to a selected output a corresponding transmission gate or is coupled directly to the first transmission gate 114. The decoders 148, 150 effectively route the trigger pulse to selected transmission gates, although beyond the decoders 148, 150, the pulse is referred to as a gating pulse.

The trigger pulse 302 also triggers the second adder 156 to add the second control number to its output (assumed to be zero at the start of the X+1th period) so that the second adder 156 output becomes two. Table 1 reflects the fact that each trigger pulse initiates selection by the first and second decoders 148,150 before addresses applied to the first and second decoders 148, 150 are updated in response to the same trigger pulse. Thus updated addresses caused by each trigger pulse are used during a subsequent reference clock period. Alternatively, a delay is inserted between the output of the AND gate 154 and the trigger inputs of the first and second decoders 148, 150 so that new addresses generated in response to each trigger pulse are used in the same reference clock period in which the trigger pulse is generated.

Because the output of the second adder is assumed to be 0 at the start of the X+1th reference clock cycle, the value applied to the first decoder address select inputs 148A is zero and the first decoder outputs a pulse on an output among the plurality of outputs 148B that is connected to the first transmission gate 114 in order to select the zeroth tap 108B. The zeroth tap 108B is thereby coupled to the common output 130 allowing a pulse 402 that is positioned (temporally) near the beginning of the reference clock period to reach the common output 130.

At approximately the same time, the third adder 158 adds the third control number to the output of the second adder 156 and applies the resulting sum (0+3)=3 to the second decoder address select inputs 150A, causing the second decoder 156 to output a gating pulse onto the gate signal delay line 140 that is coupled to the transmission gate 120 that is coupled to the $3^{rd}$ tap 108E. The $3^{rd}$ tap 108E is thereby coupled to the common output 130 allowing a pulse that is positioned about ¾ into the X+1 reference clock period to reach the common output 130. Note that the $3^{rd}$ tap 108E is spaced from the zeroth tap 108B by a propagation delay time of ¾ of the reference clock 104 period.

In the X+2 reference clock period addition of the first control number 4/6 to the previous output of the first adder 152, causes the first adder 152 to overflow and its output to become zero. Consequently another trigger pulse 304 is generated causing the first decoder 148 to select an output among its outputs 148B based on the value to which the second adder 156 output was updated during the preceding X+1 reference clock period, i.e., two. The latter selection leads to the second tap 108D being coupled to the common output 130, and another pulse 404 that is positioned about half way through the X+2 reference clock period to be coupled from the main delay line 108 to the common output 130.

Also in the X+2 reference clock period, the third adder 150 adds the third control number which has the value of three to the output of the second adder 156 producing an output sum of five that is applied to the address select inputs 150A of the second decoder 150. The second decoder consequently selects an output that is coupled to the gate signal delay line 142 that is coupled to the transmission gate 124 that is coupled to the fifth (out of 0 to 7) tap 108G of the main delay line 108. The gate signal delay line 142 that is selected preferably has a propagation delay length of about ⅝ of the reference clock period (commensurate with the spacing between the fifth tap 108G and the zeroth tap 108B. Consequently the output of the second decoder will be delayed by about ⅝ of the reference clock period within the gate signal delay line 142, and the fifth tap 108G will not be coupled to the common output 130 until about $¼^{th}$ into the following X+3 reference clock period. Thus in this instance the selection of the tap is initiated in a first clock period, but the coupling of the selected tap to the common output 130 is delayed until a successive reference clock period. The selection of the second decoder 150 during the X+2 reference clock period leads to pulse 506 that is positioned ¼ into the X+3 reference clock period.

The gate signal delay lines 134–146 serve a windowing function. The start of windows (time periods) during which each tap 108B–108I is coupled to the common output is controlled by the propagation delay lengths of the gate signal delay lines. The duration of the windows is determined by the duration of the trigger pulses. In the embodiment shown in FIG. 1 the window functions insure that selected taps are coupled to the common output at the correct time.

In the X+3 reference clock period the output of the first adder 152 is increased from 0 by the first control number 4/6 to 4/6, without causing an overflow. Therefore a trigger pulse will not be generated and no pulse selection will be initiated in the X+3th reference cycle. However the coupling of the fifth tap 108G to the common output 130 does occur in the X+3 period, producing the output pulse 506. The X+3 reference clock period is equivalent to the Xth reference clock period. Similarly the X+4 reference clock period is equivalent to the X+1 reference clock period.

As shown in FIG. 6 reference clock pulses selected by the first decoder shown in FIG. 4 combine with reference clock pulses selected by the second decoder shown in FIG. 5 to produces a sequence pulses that are characterized by a period that is ¾ of the period of the reference clock shown in FIG. 1. In other words a signal that has a frequency that is 33% greater than the frequency of the reference clock 130 is produced. As discussed above the design shown in FIG. 1 is readily extended by adding more taps to the delay line 108, and adding more decoders, so that frequencies that are many times higher than the reference clock 104 frequency may be generated.

In the first embodiment 100, in order to be able to delay the coupling of a tap selected during a first reference clock period until the next reference clock period, the main delay line 108 has a propagation delay length that is greater than the period of the reference clock, and taps 108G–108I of the main delay line 108 that are separated from the zeroth tap 108B by more than one period of the reference clock are provided. These taps 108G–108I are accessed through gate signal delay lines 124–128 that have delay lengths (e.g. 5/4 Tref, 6/4 Tref, 7/4 Tref) that are also greater than the reference clock period Tref. Selection information is effectively stored in these gate signal delay lines until the next reference clock period.

Figure 7:
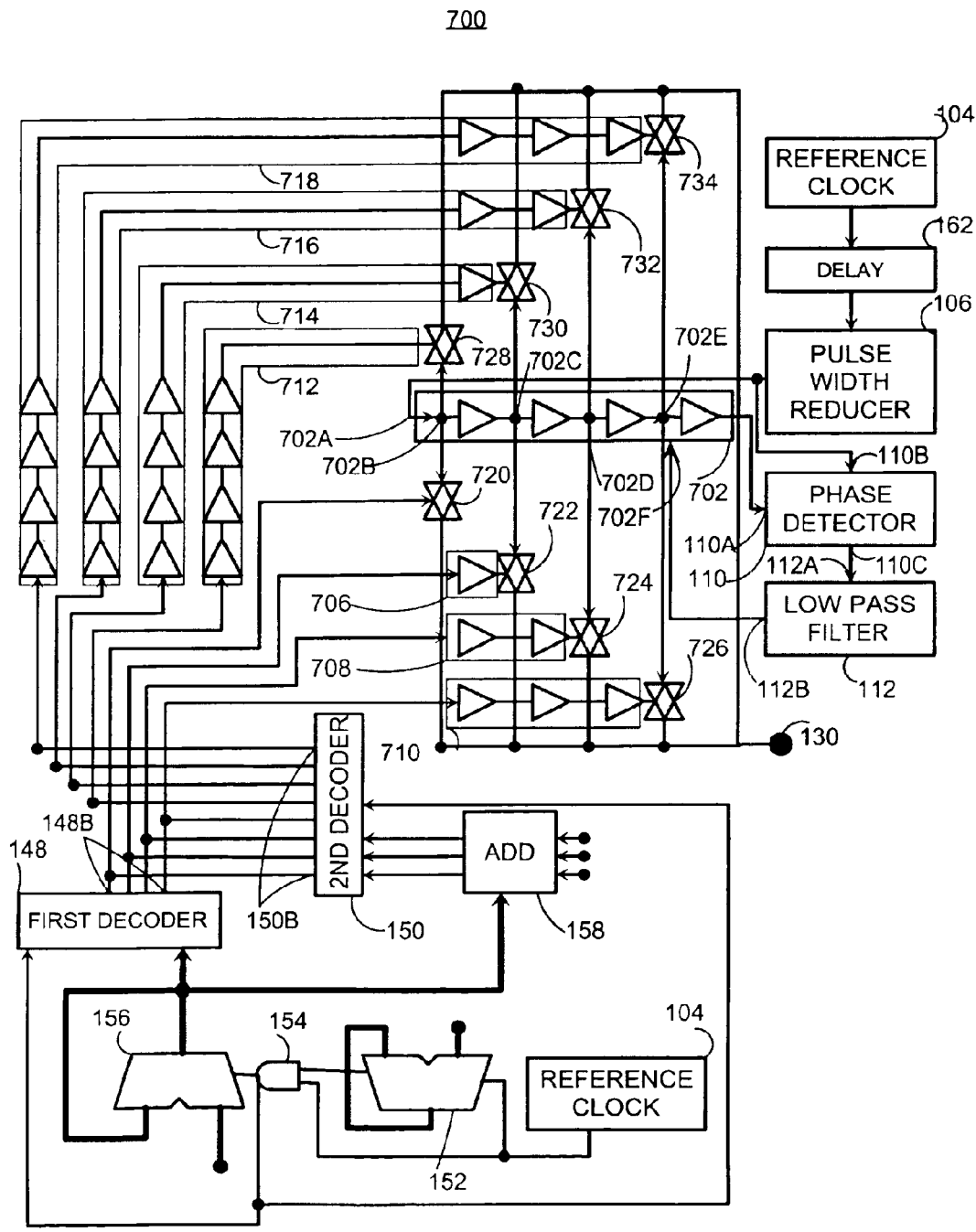
FIG. 7 is a block diagram of a digital frequency synthesizer according to a second embodiment of the invention.

FIG. 7 is a block diagram of a digital frequency synthesizer 700 according to a second embodiment of the invention. In the second digital frequency synthesizer 700 a shorter main delay line 702 that preferably has a propagation delay length that is about equal to the reference clock period is used.

Nonetheless, in the second frequency synthesizer the coupling of taps selected in one period of the reference clock 104 may be deferred until a successive period of the reference clock 104. This is accomplished by providing gate signal delay lines 706–718, several 712–718 of which have propagation delay lengths of greater than at or greater than one period of the reference clock 104. Selection decisions are effectively stored as gating pulses in these long gate signal delay lines 712–718 until the successive period.

In the second digital frequency synthesizer, the arrangement for controlling the selection of signals by the decoder 148, 150 including the first adder 152, AND gate 154, second adder 156, and third adder 158 function as in the digital frequency synthesizer 100 according to the first embodiment. Referring to FIG. 7, the first decoder 148 includes outputs 148B coupled to a first set of gate signal delay lines 706–710 and a first transmission gate 720. Each of the first set of gate signal delay lines 706–710 is coupled to one of a first plurality of transmission gates 722–726. Each of the first plurality of transmission gates 722–726 is coupled to one of a plurality of taps 702C–702E of the main delay line 702. The first transmission gate 720 is coupled to a zeroth tap 702B of the main delay line 702. The propagation delay length of each of the first plurality of gate signal delay lines 706–710 is about equal to the propagation delay from an input 702A of the main delay line 702 to a tap of the main delay line 702 that is coupled to a transmission gate to which the gate signal delay line in question is coupled.

The second decoder 150 includes a plurality of outputs 150B that are coupled to the first transmission gate 720, the first set of gate signal delay lines 706-710, and to a second set of gate signal delay lines 712–718. The second set of gate signal delay lines 712–718 are also used to access the taps 702B–702E of the main delay line 702. However the second set of gate signal delay lines 712–718 have propagation delay lengths that are greater by about one period of the reference clock 104. Specifically considering pairs of gate signal delay lines, one in the first set 706–710 and one in the second set 712–718, both of which are used to access the same tap of the main delay line 702, the gate signal delay line in the second set has a propagation delay length that is about one period of the reference clock 104 greater than the gate signal delay line in the first set. A first gate signal delay line 712 among the second plurality of gate signal delay lines 712–718 has a propagation delay length of about the reference clock period. Each of the second set of delay lines 712–718 is coupled to one of a second plurality of transmission gates 728–734. As alluded to above, each of the second plurality of transmission gates 728–734 are coupled to one of the plurality of taps 702B–702E of the main delay line 702. The operation of the second digital frequency synthesizer 700 is analogous to the operation of the first digital frequency synthesizer.

In the embodiment shown in FIG. 7, the phase detector 110, and the low pass filter 112, serve to maintain the propagation delay length of the main delay line at about one period of the reference clock.

According to an alternative embodiment of the invention (not shown) rather than coupling two separate transmission gates to each of the plurality of taps 702B–702D of the main delay line 702, a single transmission gate is coupled to each tap of the first set of gate signal delay lines 704–710, and one of the second set of gate signal delay lines 712–718 is coupled to each transmission gate.

As discussed above with reference to table 1, in certain instances (e.g., in the N+2 period of the reference clock shown in table 1) a tap is selected that is to be coupled to the common output during a successive reference clock period. In both the first 100 and the second 700 digital frequency synthesizers this is facilitated by providing a number of gate signal delay lines that have propagation delay lengths that exceed one period of the reference clock 104.

Figure 8:
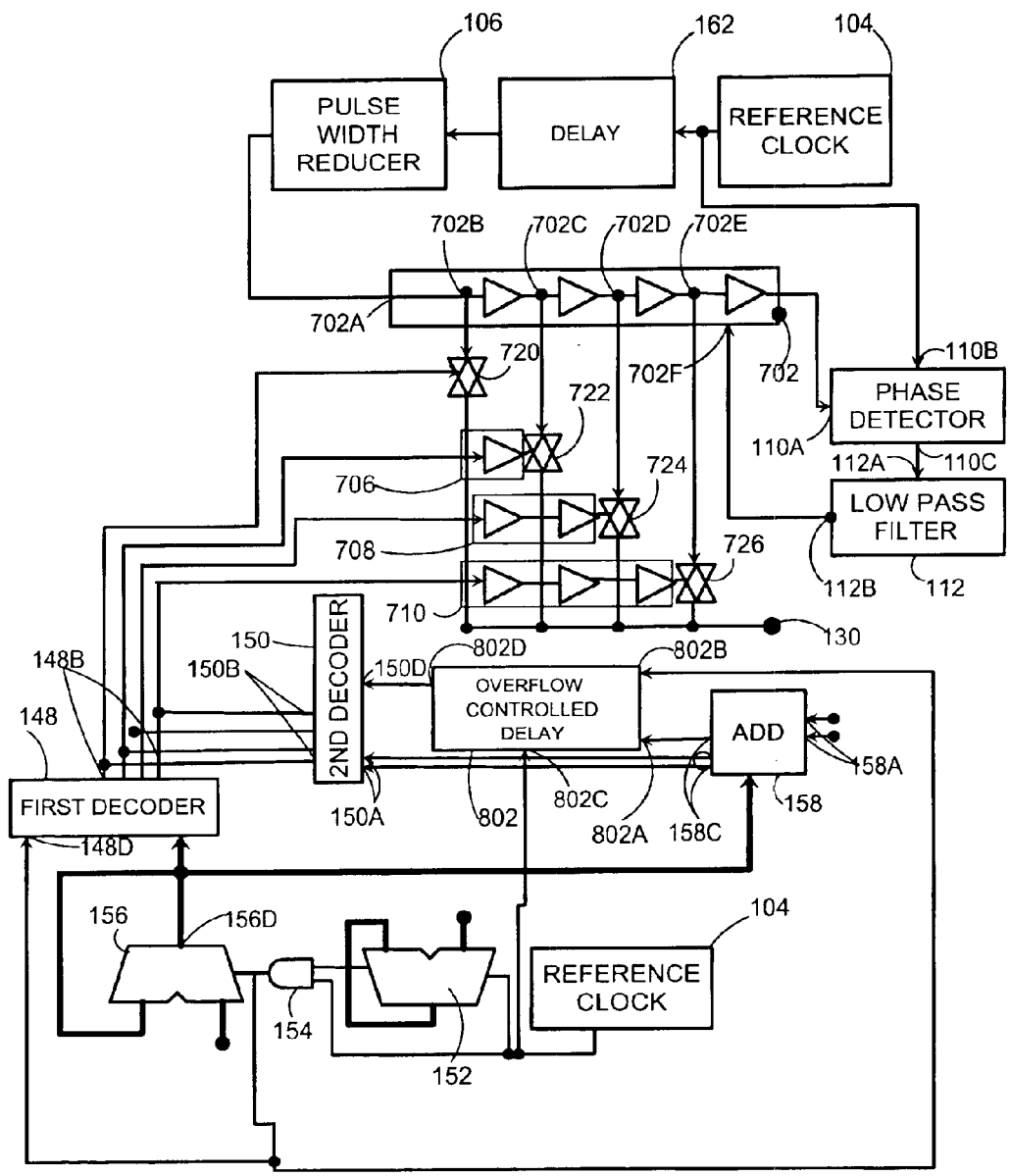
FIG. 8 is a block diagram of a digital frequency synthesizer according to a third embodiment of the invention.

FIG. 8 is a block diagram of a digital frequency synthesizer 800 according to a third embodiment of the invention. In the third digital frequency synthesizer 800, delaying of coupling of taps of the main delay line 702 is accomplished by the provision of an overflow controlled delay 802 that selectively delays the trigger signal output by the AND gate 154 from reaching the second decoder's trigger input 150D. Referring to FIG. 8, in the third digital synthesizer 800, outputs 148B, 150B of the first and second decoders 148, 150 are coupled to the first transmission gate 720 and to the first set of gate signal delay lines 706–708. The longer second set of gates signal delay lines 712–718 shown in FIG. 7 are not used in the third digital frequency synthesizer 800. In the third digital frequency synthesizer those longer gate signal delay lines 712–718 are not needed for delaying the coupling of taps of the main delay line 702 until a subsequent reference clock period.

In the third digital frequency synthesizer 800, the output of the AND gate 154 is coupled to a trigger signal input 802B of the overflow controlled delay 802. The overflow controlled delay 802 further comprises a trigger signal output 802D for outputting the trigger signal after an overflow controlled delay period. The overflow controlled delay 802 further comprises a delay control input 802A that is coupled to a most significant bit or an overflow bit that is included in the output 158C of the third adder 158. In the third digital frequency synthesizer 800, the output 156D of the second adder 156 is two bits wide so that one of the four taps 702B–702E of the main delay line 702 may be designated. Two bit addresses output by the second adder 156 are preferably input directly to the first decoder 148 for selecting one of the four taps 702B–702E. In the third digital frequency synthesizer, the first input 158A of the third adder 158 is also preferably two bits wide, and the output 158C of the third adder is preferably three bits wide or two bits wide plus an overflow bit. The least significant two bits (or simply the two bits in the case of a two bit plus overflow output 158C), of the output 158C are applied to the address inputs 150A of the second decoder 150 and used to select one of the four taps 702B–702E of the main delay line 702. If the most significant bit or overflow bit is non zero, a tap selection during a successive clock cycle is indicated. In other words the output of the third adder 158 is designating a hypothetical tap that is spaced by a propagation delay of more than one reference clock period from the zeroth tap 702B. The latter is effectively accomplished by selecting the designated tap during the successive reference clock period. In accordance with the value of the most significant bit of overflow bit, the trigger signal is selectively delayed until the successive reference clock period. The overflow controlled delay also includes a reference clock input 802C.

Figure 9:
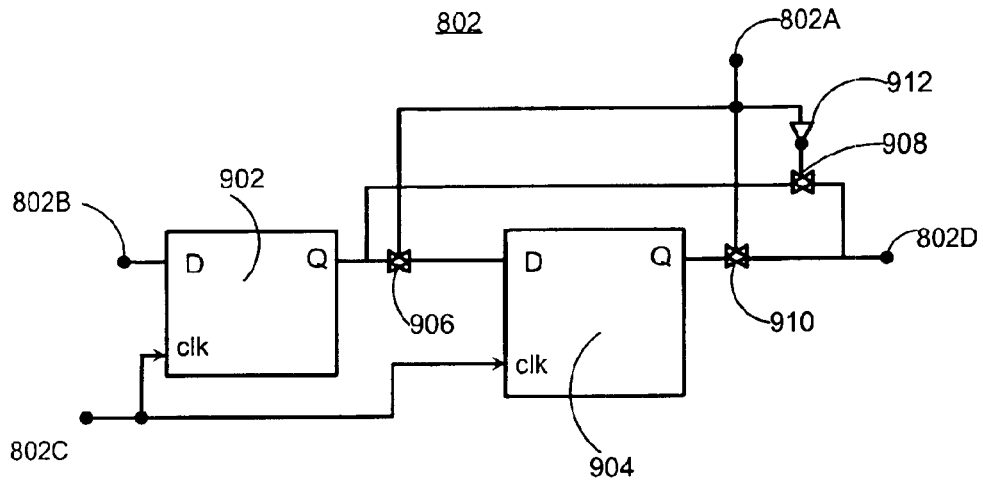
FIG. 9 is a schematic diagram of an overflow controlled delay used in the digital frequency synthesizer shown in FIG. 8 according to an embodiment of the invention.

FIG. 9 is a schematic diagram of the overflow controlled delay 802 used in the digital frequency synthesizer shown in FIG. 8 according to an embodiment of the invention. The trigger signal input 802B is applied to a data input of a first D flip flop 902. An output of the first D flip flop 902 is coupled through a first transmission gate 906 to an input of a second D flip flop 904. The output of the first D flip flop 902 is also coupled through a second transmission gate 908 to the trigger signal output 802D of the overflow controlled delay 802. An output of the second D flip flop 904 is coupled to the trigger signal output 802D of the overflow controlled delay 802 through a third transmission gate 910. The delay control input 802A is coupled to gate control terminals of the first and third transmission gates 906, 910. The delay control input 802A is also coupled through an inverter 912 to a gate control terminal of the second transmission gate 908. The reference clock input 802C of the overflow controlled delay 802 is coupled to clock inputs of the first and second D flip flops 902, 904.

When the most significant bit or overflow bit is zero, the first and third transmission gates 906, 910 are open and the second transmission gate 908 is closed, so that the second D-flip flop 904 is effectively bypassed. Under the latter circumstance, the reference clock signal causes the first D flip flop 902 to pass the trigger signal received at the trigger signal input 802B to the output of the first D flip flop 902, and from there the trigger signal is coupled through the second transmission gate 908 to the trigger signal output 802D of the overflow controlled delay 802.

On the other hand, when the most significant bit or overflow bit is one, the second transmission gate 908 is open, and the first and third transmission gates 906, 910 are closed. In the latter circumstance the trigger signal must be clocked through both the first and second D flip flops 902, 904 so that the trigger signal is delayed by one reference clock period.

Figure 10:
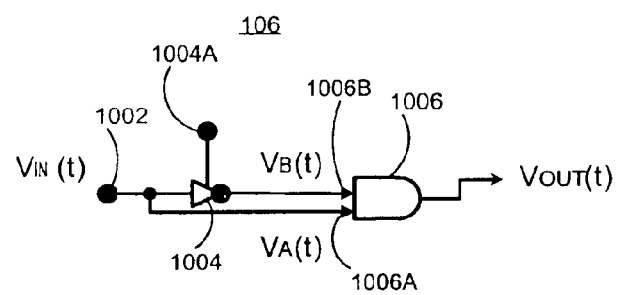
FIG. 10 is a schematic of a pulse width reducer used in the digital frequency synthesizers shown in FIGS. 1, 7, 8 according to an embodiment of the invention.
Figure 11:
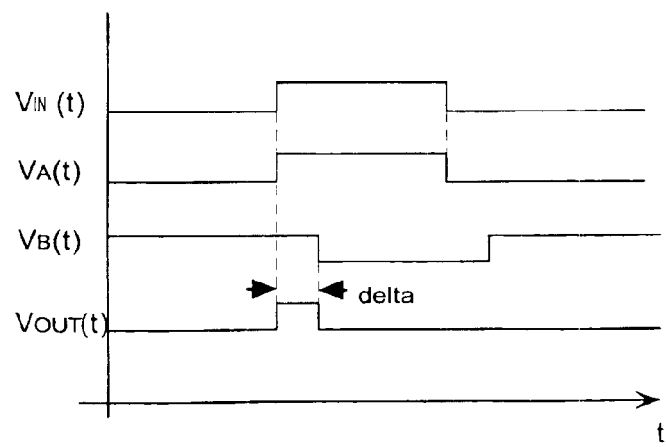
FIG. 11 is a graph showing several signals present in the pulse width reducer shown in FIG. 10.

FIG. 10 is a schematic of a pulse width reducer 100 used in the digital frequency synthesizers shown in FIGS. 1, 7, 8 according to an embodiment of the invention and FIG. 11 is a graph showing several signals present in the pulse width reducer 106 shown in FIG. 10. The pulse width reducer 106 includes a clock signal input 1002 that is connected to a first input 1006A of an AND gate 1006, and is coupled through an inverter 1004 to a second input 1006B. In FIG. 11 the signal applied to the clock signal input is labeled Vin(t). The latter is equivalent to the signal applied to the first input 1006A of the AND gate 1006 and is labeled $V_A(t)$ in FIG. 11. The signal applied to the second input 1006B of the AND gate 1006 is labeled $V_B(t)$ in FIG. 11. As shown in FIG. 11 the signal applied to the second input 1006B is an inverted and delay version of the signal applied to the first input 1006A of the AND gate 1006. The delay of the signal applied to the second input 1006B relative to the signal applied to the first input 1006A arises from the propagation delay of the inverter 1004. The delay is labeled delta in FIG. 11. The AND gate 1006 performs an AND function between the signals applied to the first and second inputs 1006A, 1006B and outputs the reduced pulse width clock signal. The signal output by the AND gate 1006 is labeled Vout(t) in FIG. 11. The pulse width of the clock signal produced by the AND gate 1006 is approximately equal to the delay caused by the inverter 1004. The inverter 1004 includes a propagation delay control terminal 1004A. The propagation delay control terminal 1004A may be used to supply a supply current to the inverter 1004, which may be changed in order to change the propagation delay of the inverter 1004. Alternatively propagation delay may be controlled by loading the output of input of the inverter 1004 with a varactor (not shown). It may be desirable to adjust the propagation delay width of the inverter 1004 so as to obtain a clock signal pulse width which is equal to one half of the period of the signal that the digital frequency synthesizers 100, 700, 800 are set to produce. Doing so leads to a output signal that is characterized by a 50% duty cycle which may be desirable for certain application such as modulation, and demodulation. Alternatively, the output of the frequency synthesizers may be coupled through a divide-by-two frequency divider which outputs a 50% duty cycle.

Figure 12:
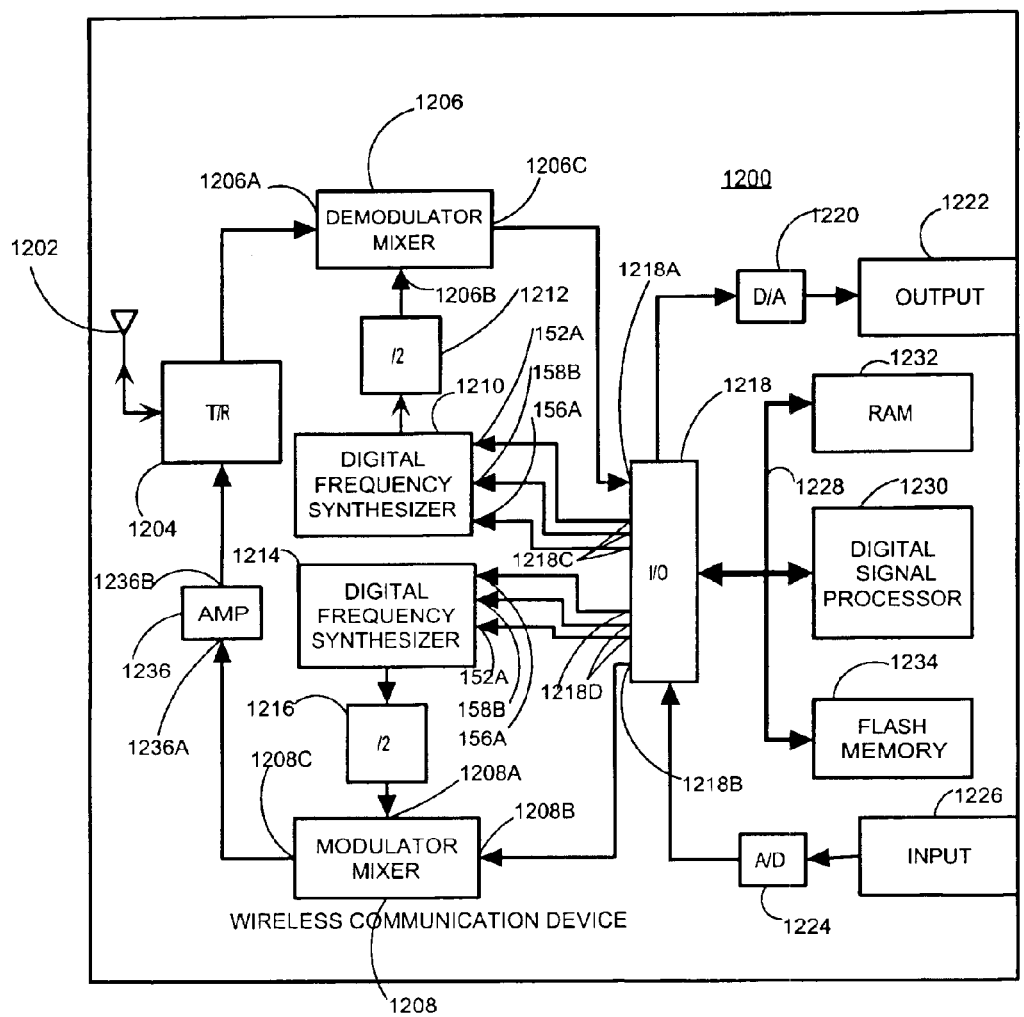
FIG. 12 is a block diagram of a wireless communication device using digital frequency synthesizers such as shown in FIGS. 1, 7, 8, 13, 15 according to an embodiment of the invention.

FIG. 12 is a block diagram of a wireless communication device 1200 using digital frequency synthesizers such as shown in FIGS. 1, 7, 8, 13, 15 according to an embodiment of the invention. Referring to FIG. 12, an antenna 1202 is coupled to a transmit-receive (T/R) switch 1204. The (T/R) switch 1204 is coupled to a first input 1206A of a demodulator mixer 1206 and to an output 1236B of an amplifier 1236. An input 1236A of the amplifier 1236 is coupled to an output 1208C of a modulator mixer 1208. A first digital frequency synthesizer 1210 is coupled through a first divide-by-two frequency divider 1212 to a second input 1206B of the demodulator mixer 1206. The demodulator mixer 1206 mixes a frequency divided version of a signal output by the first digital frequency synthesizer 1210 with a signal received from the T/R switch 1204 and outputs a demodulated signal at an output 1206C. The output 1206C is coupled to a first input 1218A of an input-output (I/O) interface 1218.

Alternatively the demodulator is a superheterodyne type that includes two mixers, and signals from two digital frequency synthesizers are coupled to the demodulator mixer 1206.

Referring again to the embodiment shown in FIG. 12, a second digital frequency synthesizer 1214 is coupled through a second divide-by-two frequency divider 1216 to a first input 1208A of the modulator mixer 1208. Rather than using the first and second frequency divider 1212,1216 the pulse width of signals output by the first and second digital frequency synthesizers 1210, 1214 may be adjusted to obtain 50% duty cycle. The first and digital frequency synthesizers 1210 1214 may be of the type shown in FIGS. 1, 7 or 8. A first output 1218B of the I/O interface 1218 is coupled to a second input 1208B of the modulator mixer 1208. The modulator mixer 1208 mixes a base band signal received from the I/O interface 1218 with a frequency divided version of a signal output by the second digital frequency synthesizer 1214 and outputs an RF signal that includes information derived from the base band signal.

The I/O interface 1218 further comprises a first plurality of outputs 1218C that are coupled to the inputs 152A, 156A, 158B of the first digital frequency synthesizer 1210 at which the first, second and third control numbers are to be received. Similarly the I/O interface comprises a second plurality of outputs 1218D that are coupled to the corresponding inputs 152A, 156A, 158B of the second digital frequency synthesizer 1214. Thus frequencies of signals produced by the first and second digital frequency synthesizers 1210, 1214 shown in FIG. 12 may be controlled through the I/O interface 1218.

The I/O interface 1218 is also coupled through a digital to analog converter (D/A) 1220 to an analog output 1222. In the case that the wireless communication device 1200 is a wireless telephone, the output 1222 preferably comprises a speaker. The I/O interface 1218 is also coupled through an analog to digital converter 1224 to an analog input 1226. In the case that the wireless communication device 1200 is a telephone, the input preferably comprises a microphone. In the case that the wireless communication device 1200 is a transponder, the D/A 1220, the output 1222, the A/D 1224, and input 1226 may be eliminated.

The I/O interface 1218 is also coupled through a digital signal bus 1228 to a programmable digital signal processor (DSP) 1230, a random access memory (RAM) 1232, and a flash memory 1234. The wireless communication device 1200 operates under the control of programs that are stored in the flash memory 1234 and executed by the DSP 1230. The RAM 1232 is used as a work space by the DSP 1230 for executing the programs stored in the flash memory 1234. Two sets of the first second and third control numbers that establish the output frequencies of the digital frequency synthesizers 1210, 1214, are stored in flash memory 1234. These sets of control numbers are read by the DSP 1230, and subsequently written, through the I/O interface 1218, to the first input 152A of the first adder 152, the first input 156A of the second adder 156, and the second input 158B of the third adder 158 in each of the first and second digital frequency synthesizers 1210, 1214 of the wireless communication device 1200. Thus the frequencies of operation of the wireless device 1200 for transmitting and receiving signals are set according to sets of control numbers stored in the flash memory 1234.

In as much as the operating frequencies of the wireless communication device 1200 are set according to values stored in the flash memory 1234, the wireless communication device is said to be software configurable. The fact that the wireless communication device 1200 is software configurable provides a number of benefits. It allows one such device to be engineered to serve a variety of markets that require different operating frequencies. Furthermore, the need and cost associated with maintaining an inventory of devices for operation in different frequency bands is reduced. Moreover, a user's device may be reprogrammed if a need arises for the device to operated within different frequency bands.

In accordance with the preferred embodiments of the invention during each during each kth clock signal period a plurality of taps are selected that are spaced from each other by delays that when divided by the reference clock period yield remainders that are about equal to integer multiples of a period of a signal to be generated. More preferably, during each kth clock signal period a plurality of taps that are spaced from each by about the period of the signal to be generated are coupled to the common output 130.

In order to maintain the period of the signal being generated at the transitions between periods of the reference clock, in the case that a tap selected during a kth clock signal period is spaced from the zeroth tap (108B, 702B) of the main delay line by a first propagation delay that when divided by the clock signal period yields a first remainder that when subtracted from the clock signal period yields a difference that is less than the period of the signal to be generated, selecting during a successive (k+1)th clock signal period a first selected tap is spaced from the zeroth (108B, 702B) tap by second propagation delay that when divided by the reference clock period yields a second remainder that when added to the difference yields a sum that is equal to the generated signal period. In this manner the total time delay between the coupling of the last tap selected during the kth clock signal period and coupling of the first tap selected during the (k+1)th clock signal period may be made equal to the period of the signal that is generated. In the case that the propagation delay length of the main delay line 702 (as in the second and third embodiments) is slightly less than one period of the reference clock, the period of the generated signal is maintained at transitions between periods of the reference clock by selecting during each kth clock signal period a last tap that is positioned furthest from the zeroth tap 702B of the main delay line 702, and is separated from the zeroth tap 702B by a first propagation time that when subtracted from the clock signal period yields a difference that when added to a second propagation delay time between the zeroth tap of the main delay line and the first tap selected during each successive (k+1)th clock signal period is about equal to the generated signal period.

Figure 13:
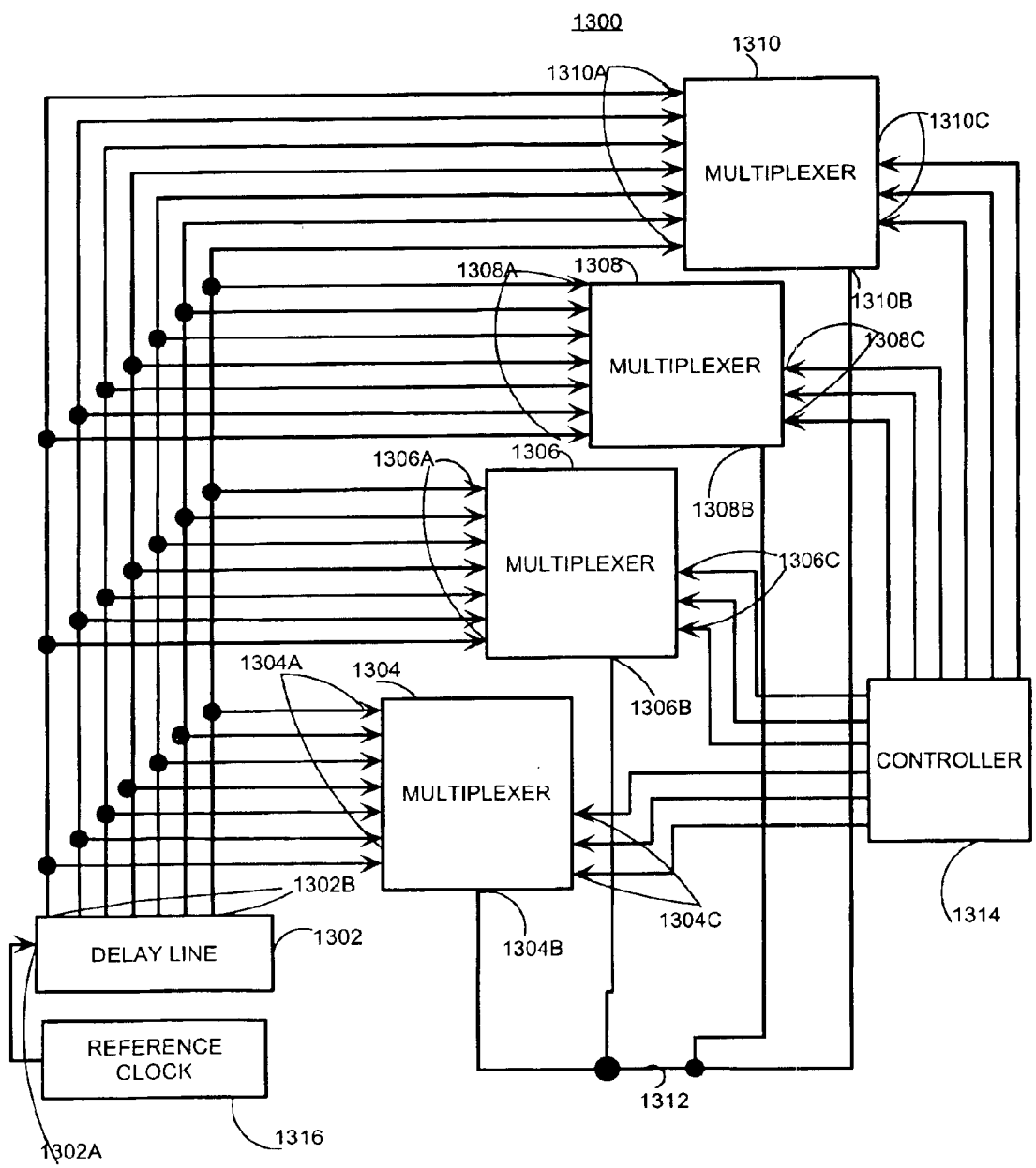
FIG. 13 is a block diagram of a digital frequency synthesizer according to a fourth embodiment of the invention.

FIG. 13 is a block diagram of a digital frequency synthesizer 1300 according to a fourth embodiment of the invention. The fourth digital frequency synthesizer 1300 comprises a single main delay line 1302 that includes an input 1302A that is coupled to a reference clock 1316 and a plurality of output taps 1302B that are coupled to signal inputs 1304A, 1306A, 1308A, 1310A of four separate multiplexers 1304, 1306, 1308, 1310. Each of the multiplexers 1304, 1306, 1308, 1310 includes an output 1304B, 1306B, 1308B, 1310B respectively, that is coupled to a common output 1312. Each of the multiplexers 1304, 1306, 1308, 1310 also comprises a set of address inputs 1304C, 1306C, 1308C, 1310C that are coupled to a controller 1314. The controller 1314 outputs control signals that are applied to the address inputs 1304C, 1306C, 1308C, 1310C of the multiplexers 1304, 1306, 1308, 1310 in order to cause the multiplexers 1304, 1306, 1308, 1310 to couple a plurality of taps of the main delay line 1302 to the common output 1312 during each period of the reference clock 1316 so as to output at common output 1312 a signal at a frequency that exceeds the frequency of the reference clock.

Figure 14:
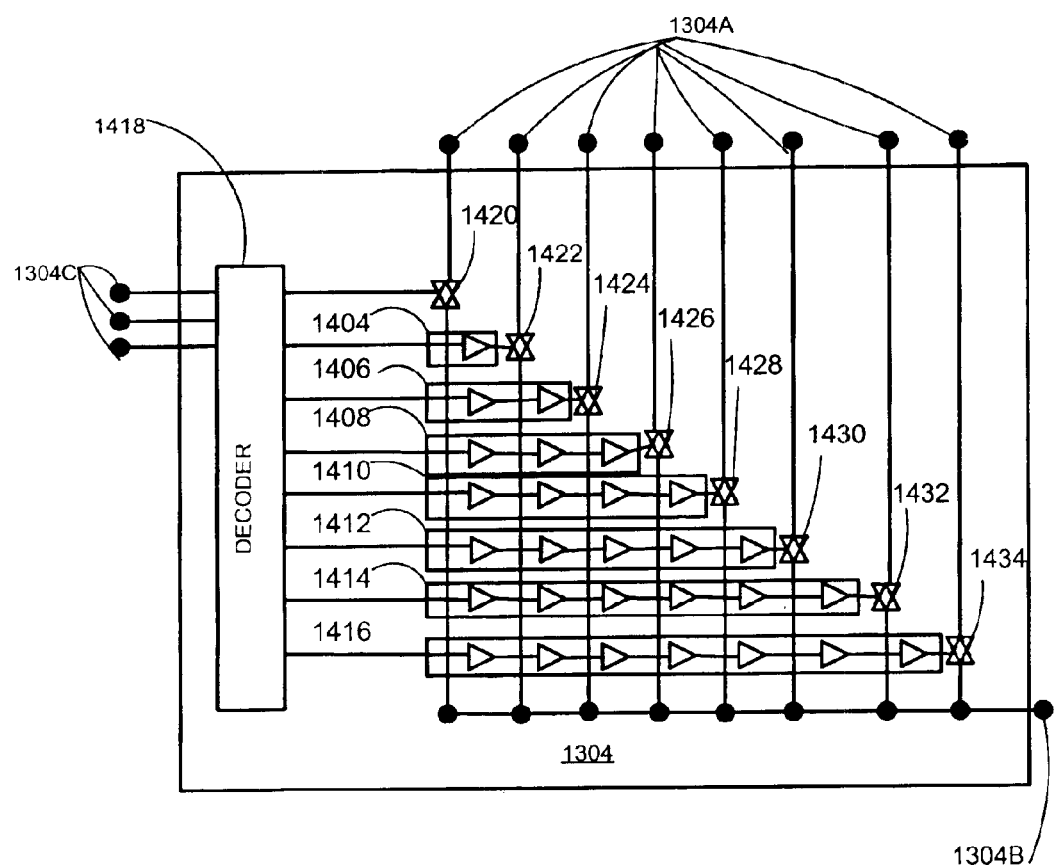
FIG. 14 is a block diagram of a multiplexer used in the digital frequency synthesizer shown in FIG. 13.

FIG. 14 is a block diagram of the multiplexer 1304 used in the digital frequency synthesizer shown in FIG. 13. The other multiplexers 1306, 1308, 1310 preferably have the same design as shown in FIG. 14. The signal inputs 1304A are coupled to first signal terminals of a plurality of transmission gates 1420–1434. Second signal terminals of the transmission gates 1420–1434 are coupled to the output 1304B of the multiplexer 1304. The address inputs 1304C serve as address inputs of a decoder 1418. The decoder 1418 includes a plurality of selectable outputs one of which is coupled directly to the first transmission gate 1420. Each of the remaining selectable outputs of the decoder 1418 is coupled to one of a plurality of gate signal delay lines 1404–1416. An output of each of the gate signal delay lines 1404–1416 is coupled to a gate terminal of one of the remaining transmission gates 1422–1434. In response to transient address signals received from the controller 1314 (FIG. 13) the decoder outputs a gating pulse either directly to the first transmission gate 1420 or onto one of the gate signal delay lines 1404–1416, thereby momentarily coupling one of the signal inputs 1304A to the output 1304B. The gate signal delay lines 1404–1416 serve as a windower of the multiplexer 1304 for determining the timing of the coupling of each of the inputs 1304A to the output 1304B.

Figure 15:
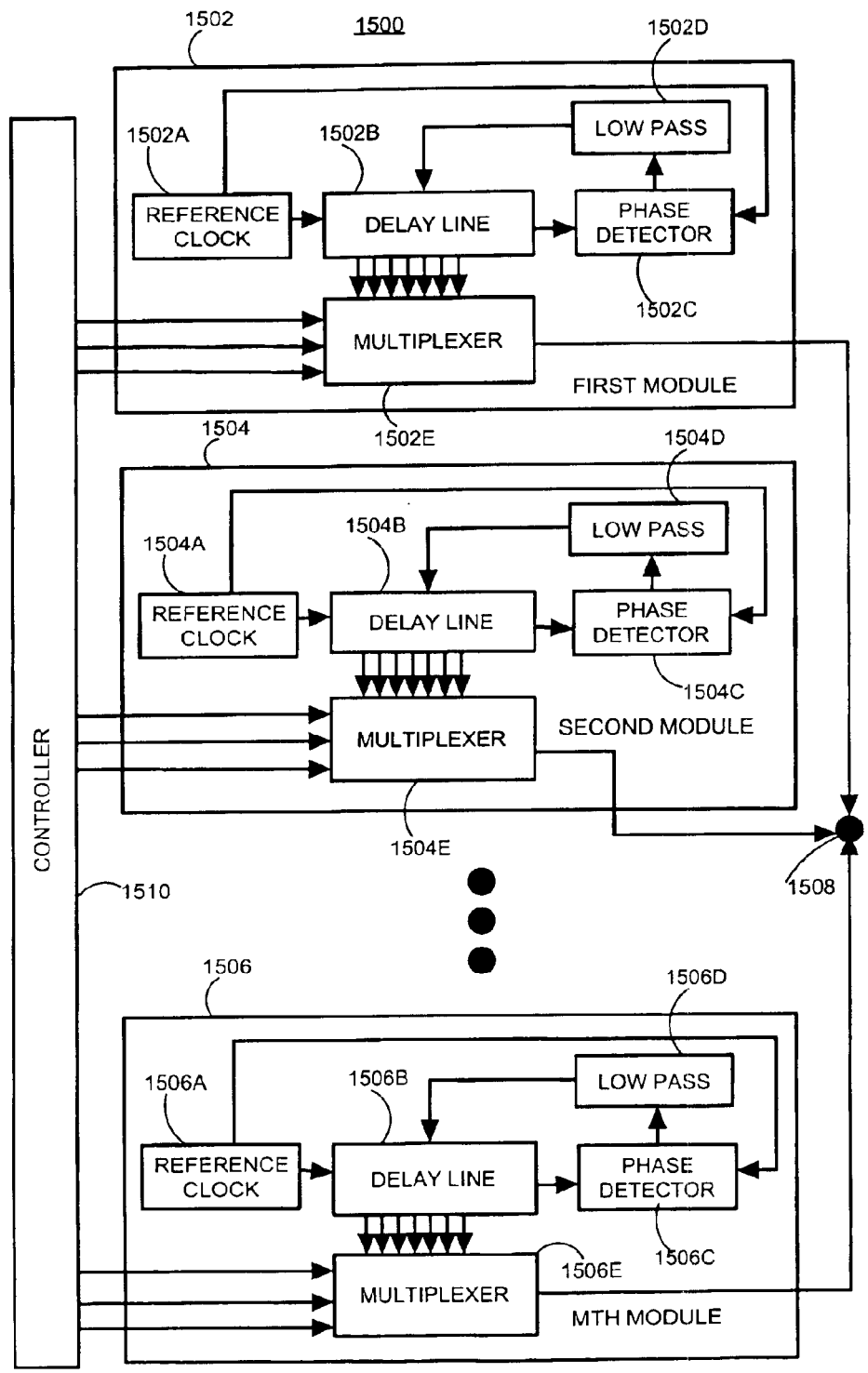
FIG. 15 is a block diagram of a digital frequency synthesizer according to a fifth embodiment of the invention.

FIG. 15 is a block diagram of a digital frequency synthesizer 1500 according to a fifth embodiment of the invention. The fifth digital frequency synthesizer 1500 comprises a first, second and Mth modules 1502, 1504, 1506. Although three modules are shown, another number of modules greater than two may be used in order to obtain output frequencies in excess of a reference clock frequency. Each of the modules 1502, 1504, 1506 includes a reference clock 1502A, 1504A, 1506A, that is coupled to a delay line 1502B, 1504B, 1506B. Each module 1502, 1504, 1506 further comprises a phase detector 1502C, 1504C, 1506C that receives a signal from the reference clock 1502A, 1504A, 1506A, and a signal output from the delay line 1502B, 1504B, 1506B. The phase detectors 1502C, 1504C, 1506C couple detected phase error signals through low pass filters 1502D, 1504D, 1506D to propagation delay control inputs of the delay lines 1502B, 1504B, 1506B. The phase detectors 1502C, 1504C, 1506C in combination with the low pass filters 1502D, 1504D, 1506D serve to maintain a fixed propagation delay through the delay lines 1502B, 1504B, 1506B. Each of the delay lines 1502B, 1504B, 1506 further comprises a plurality of output taps that are coupled to signal inputs of a multiplexer 1502E, 1504E, 1506E. The multiplexers 1502E, 1504E, 1506E include outputs that are coupled to a common output 1508 for the fifth digital frequency synthesizer 1500. The multiplexers 1502E, 1504E, 1506E further comprise address inputs that are coupled to a controller 1510. The controller 1510 serves to select output address signals in order to select a tap from two or more of the delay lines 1502B, 1504B, 1506B during selected periods of a reference clock signal output by at least one of the reference clocks 1502A, 1504A, 1506A so as to output a signal at the common output 1508 that has a frequency that exceeds a frequency of at least one of the reference clocks 1502A, 1504A, 1506A. Preferably all of the reference clocks output clock signals at a common frequency. Alternatively two or more of the reference clocks 1502A, 1504A, 1506A output clock signals at different frequencies.

Although, in the interest of pedagogical clarity, embodiments with main delay lines with relatively few taps are described above, in practice it is preferable to provide main delay lines that have at least about 512 taps. It would be desirable to be able to make the delay between adjacent taps arbitrarily small. However, for delay lines fabricated using active elements (e.g., CMOS buffers), the lower limit of the delay across each active element, imposes a limit on the delay between two adjacent taps. However this limit may be effectively circumvented, and a delay line that effectively includes a larger number of taps within a propagation delay length of one period of the reference clock may be obtained. The latter may be accomplished by choosing a delay between adjacent taps that is a multiple of an effective tap-to-tap delay that is desired, and is also a fraction of the reference clock period in which the denominator is not divisible by the numerator. The total propagation delay length of such a main delay line is preferably equal to at least the numerator times the reference clock period.

An illustrative example follows. Assume that the reference clock frequency has been chosen, and the semiconductor fabrication process to be utilized imposes an upper bound of ¼ of the reference clock period on the delay across each active element. Suppose further that it is desired to achieve an effective tap spacing of ⅛ of the reference clock period. The latter may be accomplished by selecting a tap-to-tap spacing of ⅜. If the delay line is three reference clock periods long, the following series of taps would be obtained: [0, ⅜, ⅝, ⅞, 12/8, 15/8, 18/8, 21/8]. In as much as the reference clock signal propagating in such a main delay line repeats every propagation delay length equivalent to one reference clock period, one may neglect the whole number portions of the fractions describing the propagation delay to the taps. Ignoring the whole number portions one obtains: [0, ⅜, ⅝, ⅛, 4/8, ⅞, ⅖, ⅝]. Examination of the preceding list bears out that each ⅛ increment of propagation delay length from 0 to ⅞ is represented. The fact that the taps are out of order is simply handled by connecting the taps of such a main delay line to corresponding transmission gates of a multiplexer according to a desired order.

As used in the present application the term remainder applied to a quotient is defined as follows. In the case that the denominator of the quotient exceeds the numerator of the quotient the remainder is the numerator, and in the case that the numerator exceeds the denominator the remainder is equal to the fractional part of the quotient times the denominator.

The present invention, as would be known to one of ordinary skill in the art could be produced in hardware or software, or in a combination of hardware and software. The system, or method, according to the inventive principles as disclosed in connection with the preferred embodiment, may be produced in a single computer system having separate elements or means for performing the individual functions or steps described or claimed or one or more elements or means combining the performance of any of the functions or steps disclosed or claimed.

While the preferred and other embodiments of the invention have been illustrated and described, it will be clear that the invention is not so limited. Numerous modifications, changes, variations, substitutions, and equivalents will occur to those of ordinary skill in the art without departing from the spirit and scope of the present invention as defined by the following claims.

What is claimed is:

1. A wireless communication device comprising:
   a mixer including:
      a first input for receiving a first signal that includes coded information;
      a second input for receiving a locally generated signal for mixing with the first signal;
   a digital frequency synthesizer including:
      one or more delay lines including a plurality of output taps;
      one or more clock signal sources coupled to the one or more delay lines;
      one or more multiplexers including:
         a plurality of signal inputs coupled to the plurality of output taps;
         a plurality of address inputs; and
         a common output coupled to the second input of the mixer; and
      a controller including a plurality of control signal outputs coupled to the plurality of address inputs, for causing the one or more multiplexers to couple a plurality of output taps to the common output during a plurality of periods of a clock signal generated by at least one of the one or more clock signal sources.

2. A digital frequency synthesizer comprising:
   a clock signal source for outputting a clock signal that is characterized by a clock signal period;
   a first delay line including:
      a first delay line input coupled to the clock signal source; and
      a plurality of first delay line output taps;
   a plurality of transmission gates each of which include:
      a first signal terminal coupled to one of the plurality of first delay line output taps;
      a second signal terminal coupled to a common output; and
      a gate control terminal;
   a plurality of decoders each of which includes:
      one or more decoder address inputs; and
      a plurality of decoder outputs;
   a plurality of gate signal delay lines each of which is characterized by one of a plurality of delay durations and includes:
      an input that is coupled a decoder output of each of the plurality of decoders;
      an output coupled to the gate control terminal of one of the plurality transmission gates,
   a controller including:
      a set of control signal outputs coupled to the one or more decoder address inputs of the plurality of decoders.

3. The digital frequency synthesizer according to claim 2 wherein:
   a delay associated with each gate signal delay line is commensurate with a delay that characterizes a tap of the first delay line that is coupled to a transmission gate to which the gate signal delay line is coupled.

4. The digital frequency synthesizer according to claim 2 wherein:
the delay line is characterized by a propagation delay length of about an integer multiple of the clock signal period.

5. The digital frequency synthesizer according to claim 2 wherein:
the plurality of first delay line output taps are spaced by about a fraction of the clock signal period, wherein a denominator of the fraction is indivisible by a numerator of the fraction; and
the first delay line is characterized by a propagation delay length of about the numerator of the fraction times the clock signal period.

6. The digital frequency synthesizer according to claim 2 wherein:
the first delay line further comprises:
a delay control input; and
the digital frequency synthesizer further comprises:
a phase detector including:
a first phase detector input coupled to the first delay line;
a second phase detector input coupled to the clock signal source;
a phase detector output;
a low pass filter including:
an low pass filter input coupled to the phase detector output; and
a low pass filter output coupled to the delay control input.

7. The digital frequency synthesizer according to claim 2 wherein the controller comprises:
a first adder including:
a first summand input for receiving a first control number;
a second summand input;
a first adder output coupled to the second summand input;
an overflow output; and
a first clock input coupled to the clock signal source;
a second adder including:
a second clock input coupled to the overflow output of the first adder;
a third summand input for receiving a second control number;
a fourth summand input;
a second adder output coupled to the fourth summand input wherein the second adder output serves as a subset of the set of control signal outputs of the controller.

8. The digital frequency synthesizer according to claim 7 wherein the controller further comprises:
an overflow signal duration reducer coupled between the overflow output of the first adder and the second clock input.

9. The digital frequency synthesizer according to claim 7 wherein the controller further comprises:
one or more address modifiers, each of which is interposed between the second adder output and the one or more decoder address inputs of one of the plurality of decoders.

10. The digital frequency synthesizer according to claim 9 wherein the one or more address modifiers each comprise:
an address modifier adder for adding approximately an integer multiple of a ratio of a period of a signal to be synthesized and a period of the clock signal to an address output at the second adder output.

11. The digital frequency synthesizer according to claim 10 wherein the one or more address modifiers each comprise:
a selective delayer for determining if an incremented address output by the address modifier adder exceeds a predetermined maximum address and if so delaying the address in reaching the one or more address inputs of one of the plurality of decoders by one period of the reference clock.

12. A method of digitally synthesizing a signal, the method comprising the steps of:
generating a clock signal that includes a plurality of successive clock signal periods;
reducing a pulse width of the clock signal;
coupling the clock signal to a delay line that includes:
an input end;
a plurality of taps including:
a zeroth tap that is located closest to the input end; and
a last tap that is furthest from the input end; and
during at least one clock signal period, selecting and coupling two or more of the plurality of taps to an output.

13. The method according to claim 12 wherein the step of selecting and coupling two or more of the plurality of taps to the output includes the steps of:
during each kth clock signal period selecting a plurality of taps that are spaced from each other by delays that when divided by a period of the clock signal yield remainders that are about equal to integer multiples of a generated signal period.

14. The method according to claim 13 wherein:
a last selected tap selected during each kth clock signal period is spaced from the zeroth tap by a first propagation delay that when divided by the clock signal period yields a first remainder that when subtracted from the clock signal period yields a difference that is less than the generated signal period,
selecting during a successive (k+1)th clock signal period a second selected tap that is spaced from the zeroth tap by second propagation delay that when divided by the clock signal period yields a second remainder that when added to the difference yields a sum that is equal to the generated signal period.

15. The method according to claim 12 wherein the step of coupling one or more of the plurality of taps to the output includes the steps of:
during each kth clock signal period coupling to the output a plurality of taps that are spaced from each by about a generated signal period.

16. The method according to claim 15:
the plurality of taps selected during each kth clock signal period includes:
a first selected tap that is positioned closest, among the plurality of taps, to the zeroth tap; and
a last selected tap that is positioned furthest, among the plurality of taps, from the zeroth tap; and
wherein a first propagation delay time between the zeroth tap and the last selected tap, during each kth clock signal period, when subtracted from the clock signal period yields a difference that when added to a second propagation delay time between the zeroth tap and the first selected tap for each successive (k+1)th clock signal period is equal to about the generated signal period.

* * * * *